(12) United States Patent
Takabayashi

(10) Patent No.: US 8,724,938 B2
(45) Date of Patent: May 13, 2014

(54) OPTICAL RECEIVER

(75) Inventor: Kazumasa Takabayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 220 days.

(21) Appl. No.: 13/358,595

(22) Filed: Jan. 26, 2012

(65) Prior Publication Data

US 2012/0243824 A1    Sep. 27, 2012

(30) Foreign Application Priority Data

Mar. 22, 2011  (JP) ................................ 2011-062291

(51) Int. Cl.
*G02B 6/42* (2006.01)
*G02B 6/10* (2006.01)

(52) U.S. Cl.
USPC ............................................. 385/14; 385/130

(58) Field of Classification Search
USPC ..................... 385/14, 43, 129–132
See application file for complete search history.

(56) References Cited

U.S. PATENT DOCUMENTS

| | | | |
|---|---|---|---|
| 6,396,984 B1 * | 5/2002 | Cho et al. ........................ | 385/43 |
| 6,643,432 B2 | 11/2003 | Bouda | |
| 6,710,378 B1 | 3/2004 | Makiuchi et al. | |
| 6,826,220 B2 * | 11/2004 | Balsamo et al. ............. | 372/50.1 |
| 6,934,429 B2 * | 8/2005 | Kikuchi et al. ................ | 385/14 |

FOREIGN PATENT DOCUMENTS

| | | |
|---|---|---|
| JP | 2001-127333 | 5/2001 |
| JP | 2002-243961 | 8/2002 |

OTHER PUBLICATIONS

Hyun, Kyung S. et al., "Multimode Interferometer-Fed InGaAs Waveguide Photodiode", Japanese Journal of Applied Physics vol. 47, No. 11 (2008), pp. 8426-8429.

* cited by examiner

*Primary Examiner* — Kevin S Wood
(74) *Attorney, Agent, or Firm* — Fujitsu Patent Center

(57) ABSTRACT

A tapered waveguide is provided for connection between an input waveguide and a photodiode. The width of the tapered waveguide increases as it extends from the input end that is connected to the input waveguide towards the output end that is connected to the photodiode. The tapered waveguide has an optimum half spread angle to cause higher-order mode excitation when receiving optical signal from the input waveguide. The photodiode either has a constant width or increases in width as it extends away from the output end of the tapered waveguide, its half spread angle being equal to or less than the half spread angle of the tapered waveguide.

9 Claims, 10 Drawing Sheets

OPTICAL RECEIVER

CROSS-REFERENCE TO RELATED APPLICATION

This application is based upon and claims the benefit of priority of the prior Japanese Patent Application No. 2011-062291, filed on Mar. 22, 2011, the entire contents of which are incorporated herein by reference.

FIELD

The present invention relates to an optical receiver comprising a waveguide and a photodiode mounted on one substrate to allow the photodiode to receive an optical signal that has propagated through the waveguide.

BACKGROUND

As a means of receiving quadrature phase shift keyed (QPSK) signals for coherent optical communication etc., waveguide-integrated optical receivers consisting of a hybrid optical waveguide integrated with a photodiode are promising from the viewpoint of size reduction and assembly cost reduction. A hybrid optical waveguide converts phase-modulated optical signal into intensity-modulated optical signal. A multimode interference (MMI) waveguide etc. is commonly used as hybrid optical waveguide.

A waveguide and a photodiode formed on a substrate are coupled with each other, for instance, using a butt joint structure. In the butt joint structure, an optical signal that has passed through the waveguide directly enters the absorption layer of the photodiode. Accordingly, a high light absorption efficiency can be maintained even if the photodiode size is reduced with respect to the propagate direction of the optical signal.

In the butt joint structure, on the other hand, a large part of the incident light is absorbed in a very short region that has a length of several micrometers from the light-incident end (input end) of the photodiode. Accordingly, the photo carrier density tends to increase in the neighborhood of the light-incident end. If the incident light is high in intensity, photo carriers tend to be accumulated in the absorption layer of the photodiode. The operating bandwidth of the photodiode becomes narrow because the electric field generated by the accumulated photo carriers acts to decrease the intensity of the applied electric field.

There has been a proposed technique that uses a MMI waveguide disposed between an input waveguide and a photodiode to reduce the peak with respect to the width direction of the light intensity distribution. If a single mode optical signal enters the MMI waveguide, two or more peaks will appear in the light intensity distribution at the light-emitting end (output end) of the MMI waveguide. Accordingly, the light intensity per peak decreases. Therefore, the local rise in photo carrier density caused by the incident light can be suppressed.

Light waveguide devices in which an optical signal propagating through a single mode optical waveguide is divided equally by a tapered waveguide into two or more output ports have also been known generally as an optical waveguide apparatus having the same function as the MMI waveguide.

PRIOR ART DOCUMENTS

1. Japanese Laid-open Patent Publication No. 2001-127333
2. Japanese Laid-open Patent Publication No. 2002-243961
3. K. Hyun et al., "Multimode Interferometer-Fed InGaAs Waveguide Photodiode for High Power Detection", Jpn. J. Appl. Phys. Vol. 47, No. 11, (2008) pp. 8426-8429

SUMMARY

If a MMI waveguide is disposed between an input waveguide and a photodiode, two or more peaks appear at the light-emitting end. The light intensity between the peaks is considerably lower than the peak intensities. This causes a variation in the photo carrier density distribution in the width direction in the absorption layer of the photodiode. If the incident light propagates through the photodiode, the light intensity distribution in the width direction may be changed, in some cases variation in light intensity increases. Accordingly, the photo carrier density may increase locally with an increasing intensity of the incident light.

There are growing expectations for a technique that can depress the rise in peak light intensity even if the intensity of the incident light increases.

According to an aspect of the invention, an optical receiver includes:

an input waveguide formed over a substrate, a photodiode formed over the substrate, and a tapered waveguide formed over the substrate, connecting between the input waveguide and the photodiode, and increasing in width as it extends from the input end that connects with the input waveguide to the output end that connects with the photodiode, wherein a half spread angle of the tapered waveguide is configured to cause higher-order mode excitation when receiving optical signal from the input waveguide, and the photodiode either has a constant width or increases in width as it extends away from the output end of the tapered waveguide, its half spread angle being equal to or less than the half spread angle of the tapered waveguide.

According to another aspect of the invention, an optical receiver includes:

an input waveguide formed over a substrate, a photodiode formed over the substrate, and a tapered waveguide formed over the substrate, connecting between the input waveguide and the photodiode, and increasing in width as it extends from the input end that connects with the input waveguide to the output end that connects with the photodiode, wherein the half spread angle $\theta$ of the tapered waveguide is in the following range:

$$\theta \geq -0.08 Wo^2 + 2.37 Wo - 11.5, \text{ and}$$

$$\theta \leq -0.04 Wo^2 + 1.16 Wo + 0.0145$$

where Wo [μm] denotes the width of the tapered waveguide at the joint between the tapered waveguide and the photodiode and $\theta$ [°] denotes the half spread angle, and the photodiode at the joint with the tapered waveguide has a width equal to or larger than that of the tapered waveguide at the output end, increases in width as it extends away from the output end of the tapered waveguide, and has a half spread angle $\theta pd$ in the following range:

$$0 \leq \theta pd \leq -0.04 Wo^2 + 1.16 Wo + 0.0145.$$

According to still another aspect of the invention, an optical receiver includes:

a hybrid waveguide formed over a substrate, having two input ports each designed to receive either phase-shift keyed optical signal or local oscillator light, and having two or more output ports each designed to emit intensity-modulated optical signal produced by converting the phase-shift keyed optical signal, two or more input waveguides formed over the substrate, each connected to one of the output ports of the hybrid waveguide, photodiodes formed over the substrate, each coupled to one of the input waveguides, and tapered waveguides formed over the substrate to connect between the input waveguides and the relevant photodiodes, wherein a half spread angle of each of the tapered waveguides is configured to cause higher-order mode excitation when receiving optical signal from the relevant input waveguide, and each of the photodiodes either has a constant width or increases in width as it extends away from the output end of the tapered waveguide, its half spread angle being equal to or less than the half spread angle of the tapered waveguide.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiment 1

Figure 1A:
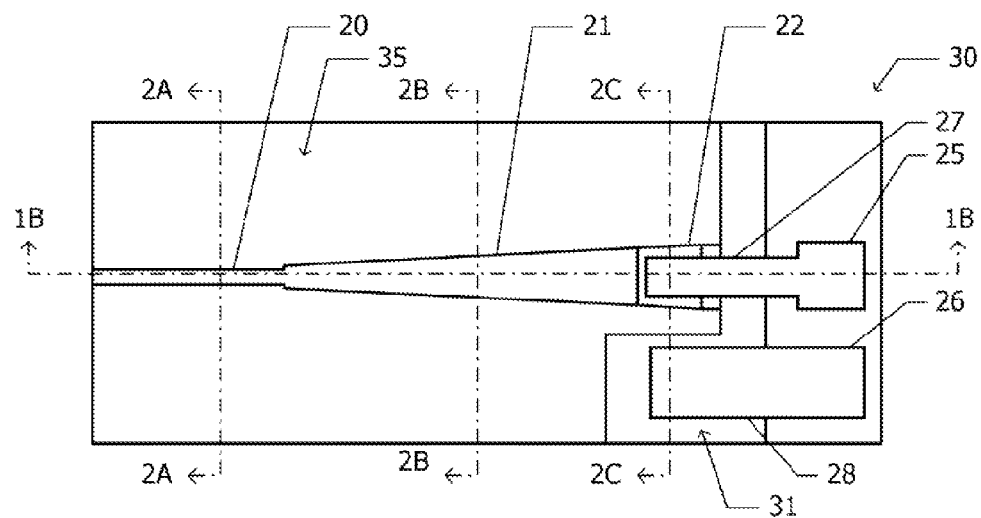
FIG. 1A is a plan view of an optical receiver according to Embodiment 1.

FIG. 1A is a plan view of an optical receiver according to Embodiment 1. An input waveguide 20, a tapered waveguide 21, and a photodiode 22 are formed on a semi-insulating substrate 30. The use of a semi-insulating substrate 30 is intended to reduce the parasitic capacitance. The input waveguide 20 is a single mode optical waveguide that allows light having a wavelength of, for instance, 1.55 µm to propagate.

The tapered waveguide 21 connects the input waveguide 20 to the photodiode 22. The width of the tapered waveguide 21 increases as it extends from the input end that is connected to the input waveguide 20 towards the output end that is connected to the photodiode 22. The width of the tapered waveguide 21 at the input end is wider than that of the input waveguide 20. The width of the tapered waveguide 21 at the output end thereof is equal to the width of the photodiode 22 at the input end thereof.

The width of the photodiode 22 increases as it extends away from the light-emitting end of the tapered waveguide 21. The spread angle of the photodiode 22 is equal to that of the tapered waveguide 21.

A semi-insulating embedding semiconductor layer 35 is formed on both sides of the input waveguide 20, the tapered waveguide 21, and the photodiode 22. At the side of the photodiode 22, the embedding semiconductor layer 35 is removed in order that an n-type cladding layer 31 is exposed. In the rear of the photodiode 22 (in the right hand portion of FIG. 1A), the n-type cladding layer 31 is removed in order that the substrate 30 is exposed.

In the region where the n-type cladding layer 31 has been removed to expose the substrate 30, a p-side electrode pad 25 and an n-side electrode pad 26 are disposed. A p-side lead electrode 27 connects the photodiode 22 to the p-side electrode pad 25. An n-side lead electrode 28 connects the n-type cladding layer 31 to the n-side electrode pad 26.

Figure 1B:
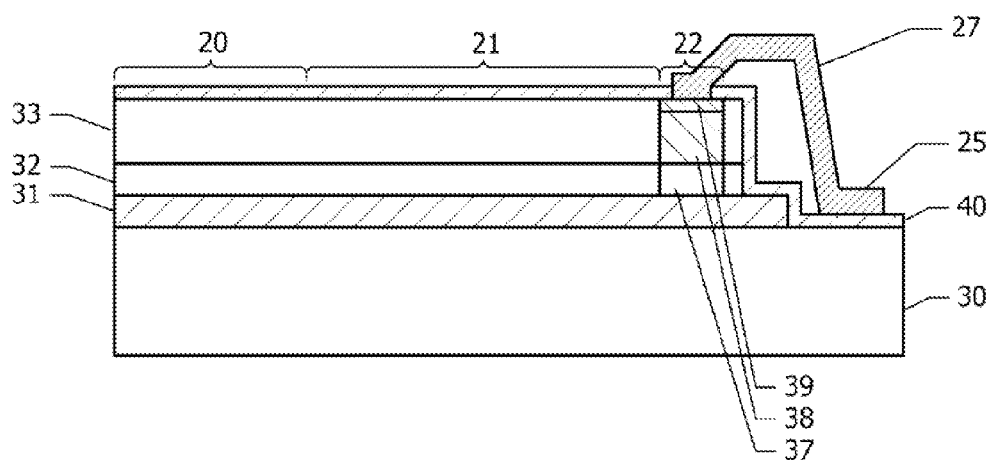
FIG. 1B is a cross section along the dashed-dotted line 1B-1B given in FIG. 1A.

FIG. 1B illustrates a cross section along the dashed-dotted line 1B-1B illustrated in FIG. 1A. The n-type cladding layer 31 is formed on the substrate 30. In the right-end portion of the substrate 30, the n-type cladding layer 31 has been removed to expose the substrate 30. A semi-insulating InP substrate may be used for the substrate 30. The n-type cladding layer 31 is formed, for instance, of an n-type InP with a thickness of 2 µm.

In the region where the input waveguide 20 and the tapered waveguide 21 are located, a core layer 32 and an upper cladding layer 33 are stacked in this order on the n-type cladding layer 31. The core layer 32 is formed, for instance, of an undoped InGaAsP with a thickness of 0.5 µm. The upper cladding layer 33 is made, for instance, of an undoped InP with a thickness of 1.5 µm.

In the region where the photodiode 22 is located, a light absorption layer 37, p-type cladding layer 38, and contact layer 39 are stacked in this order on the n-type cladding layer 31. The n-type cladding layer 31, the light absorption layer 37, and the p-type cladding layer 38 constitute the pin-type photodiode 22. The light absorption layer 37 is made, for instance, of an undoped InGaAs with a thickness of 0.5 µm. The p-type cladding layer 38 is made, for instance, of a p-type InP. The contact layer 39 consists, for instance, of two layers, namely, a p-type InGaAs layer and a p-type InGaAsP layer. The p-type cladding layer 38 and the contact layer 39 have a total thickness of 1.5 µm.

The core layer 32 of the tapered waveguide 21 and the light absorption layer 37 of the photodiode 22 are butt-coupled. After propagating through the core layer 32 of the input waveguide 20 and the tapered waveguide 21, light enters the light absorption layer 37 of the photodiode 22. Part of the core layer 32 and the upper cladding layer 33 are also located in the rear of the photodiode 22 (in the right-hand portion of FIG. 1B).

The n-type cladding layer 31 extends farther into the rear than the core layer 32 that is located in the rear of the photodiode 22. The exposed surfaces of the upper cladding layer 33, contact layer 39, n-type cladding layer 31, and substrate 30 are covered with an insulating passivation film 40. The p-side electrode pad 25 is formed on a portion of the passivation film 40 where the n-type cladding layer 31 has been removed.

The passivation film 40 has an aperture to expose part of the contact layer 39. One end of the p-side lead electrode 27 is connected to the contact layer 39 exposed in this aperture. The other end of the p-side lead electrode 27 extends to the p-side electrode pad 25. The p-side lead electrode 27 has an air bridge structure.

Figure 2A:
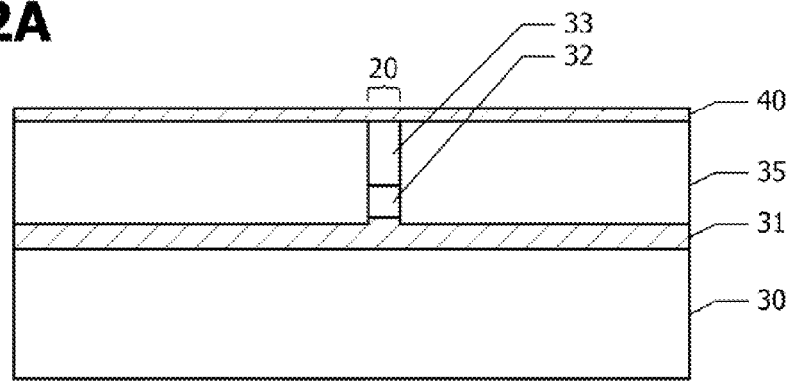
FIGS. 2A, 2B, and 2C are cross sections along the dashed-dotted lines 2A-2A, 2B-2B, and 2C-2C, respectively, given in FIG. 1A.

FIG. 2A is a cross section along the dashed-dotted line 2A-2A illustrated in FIG. 1A. The n-type cladding layer 31 is formed on the substrate 30. The core layer 32 and the upper cladding layer 33 are formed on the surface of the n-type cladding layer 31. The input waveguide mesa structure is formed by removing the core layer 32 and the upper cladding layer 33 except for the input waveguide position. The top faces of the n-type cladding layer 31 on both sides of the core layer 32 are slightly lower than the bottom of the core layer 32.

The input waveguide mesa structure consisting of the core layer 32 and the upper cladding layer 33 is embedded in the semiconductor layer 35, which fills the space on both sides of the mesa structure. The embedding semiconductor layer 35 is made, for instance, of a semi-insulating InP, whose top face coincides with the top face of the upper cladding layer 33. The passivation film 40 is formed on the embedding semiconductor layer 35 and the upper cladding layer 33. The core layer 32, and the n-type cladding layer 31, the upper cladding layer 33, and the embedding semiconductor layer 35 which surrounds the core layer 32, constitutes an embedded type input waveguide 20.

Figure 2B:
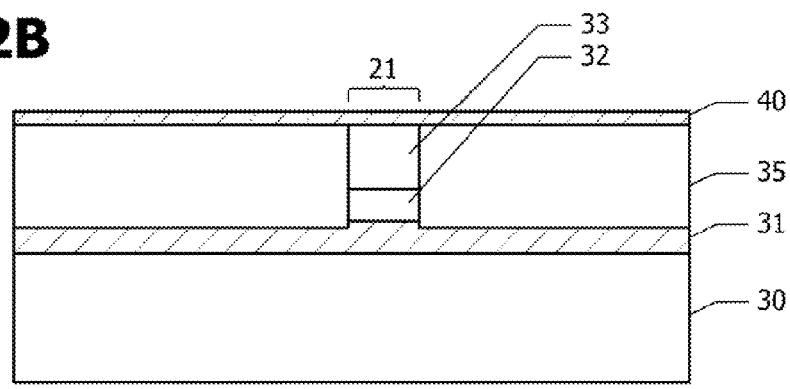

FIG. 2B is a cross section along the dashed-dotted line 2B-2B illustrated in FIG. 1A. As compared with the cross section given in FIG. 2A, the core layer 32 and the upper cladding layer 33 are wider in width than in the cross section given in FIG. 2A. The other structures are the same as that in the cross section given in FIG. 2A. The core layer 32, and the n-type cladding layer 31, the upper cladding layer 33, and the embedding semiconductor layer 35 which surrounds the core layer 32, constitutes the embedded type tapered waveguide 21.

Figure 2C:
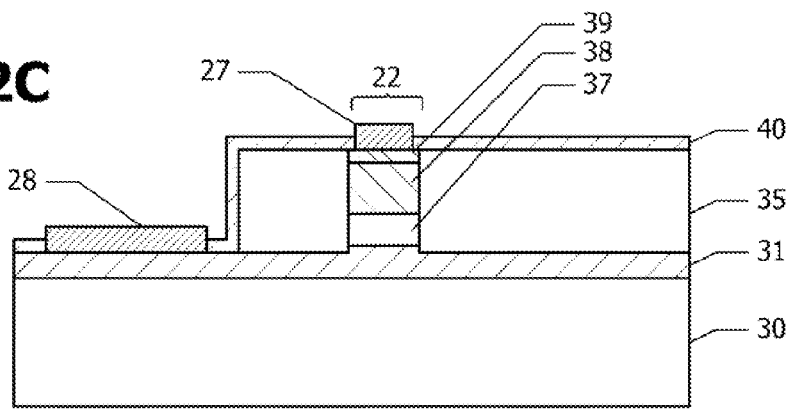

FIG. 2C is a cross section along the dashed-dotted line 2C-2C illustrated in FIG. 1A. The n-type cladding layer 31 is formed on the substrate 30. On a portion of the n-type cladding layer 31, the light absorption layer 37, the p-type cladding layer 38, and the contact layer 39 are stacked in this order. The top face of the n-type cladding layer 31 on both sides of the light absorption layer 37 are slightly lower than the bottom of the light absorption layer 37. The space on both sides of the mesa structure including the light absorption layer 37, the p-type cladding layer 38, and the contact layer 39, is filled with the embedding semiconductor layer 35. The top face of the embedding semiconductor layer 35 nearly coincides with the top face of the contact layer 39. The n-type cladding layer 31, the light absorption layer 37, and the p-type cladding layer 39 constitute the photodiode 22.

At the side of the photodiode 22, there is a region free from the embedding semiconductor layer 35. The top faces of the embedding semiconductor layer 35, the contact layer 39, and the n-type cladding layer 31 are covered with the passivation film 40. The passivation film 40 has apertures to expose part of the contact layer 39 and part of the n-type cladding layer 31. The p-side lead electrode 27 is formed on the exposed contact layer 39. The n-side lead electrode 28 is formed on the exposed n-type cladding layer 31.

A method for manufacturing the optical receiver according to Embodiment 1 is described below with reference to FIGS. 1A, 1B, and FIGS. 2A to 2C.

As illustrated in FIG. 1B, the n-type cladding layer 31, the light absorption layer 37, the p-type cladding layer 38, and the contact layer 39 are deposited on a substrate 30 of a semi-insulating InP. The metal organic chemical vapor deposition (MOCVD) process, for instance, is used for the deposition of these layers.

On the contact layer 39, a silicon oxide film is formed by, for instance, the low pressure chemical vapor deposition (LPCVD) process. This silicon oxide film is patterned using a buffered hydrofluoric acid to form a mask pattern. This mask pattern covers the photodiode 22 and regions extending from the photodiode 22 in the width direction (vertical direction in FIG. 1A) as illustrated in FIG. 1A. Using this mask pattern as etching mask, etching is carried out for the portion from the contact layer 39 to the top face of the n-type cladding layer 31.

In the region where the n-type cladding layer 31 is exposed, a core layer 32 and an upper cladding layer 33 are grown selectively. The mask pattern is removed after the selective growth. At this stage, the upper cladding layer 33 and the contact layer 39 are exposed.

On the upper cladding layer 33 and the contact layer 39, a mask pattern corresponding to the input waveguide 20, tapered waveguide 21, and photodiode 22 (FIG. 1A) are formed.

As illustrated in FIGS. 2A to 2C, etching is carried out for the portion ranging down to the top face of the n-type cladding layer 31 using this mask pattern as an etching mask. The dry etching process is used for this etching. The mesa structure that constitutes the input waveguide 20, the tapered waveguide 21, and the photodiode 22 is formed by this process. An embedding semiconductor layer 35 is grown selectively on the n-type cladding layer 31 that is exposed on both sides of the mesa structure. Then, the mask pattern is removed.

The embedding semiconductor layer 35, the upper cladding layer 33, and the core layer 32 are removed by dry etching in the region rear of the photodiode 22 illustrated in FIGS. 1A and 1B and in the region lateral to the photodiode 22 illustrated in FIGS. 1A and 2C. The n-type cladding layer 31 is exposed by this process. Furthermore, the n-type cladding layer 31 is removed by dry etching in the region rear of the photodiode 22 illustrated in FIGS. 1A and 1B. The substrate 30 is exposed by this process.

A passivation film 40 is formed over the entire surface. Apertures are formed in the passivation film 40 for contact of the p-side lead electrode 27 and the n-side lead electrode 28. Subsequently, a p-side electrode pad 25, p-side lead electrode 27, n-side electrode pad 26, and n-side lead electrode 28 are formed.

Results of simulation of the light intensity distribution in optical receivers according to Embodiment 1 and Comparative example are discussed below with reference to FIGS. 3A to 3D, FIG. 4, and FIGS. 5A to 5B.

Figure 3A:
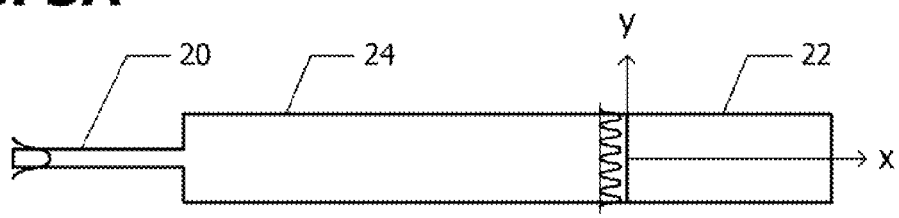
FIG. 3A is a partial plan view of an optical receiver according to the comparative example.

FIG. 3A is a partial plan view of an optical receiver according to Comparative example. In the optical receiver according to Comparative example, a MMI waveguide 24 is provided between the input waveguide 20 and the photodiode 22. The MMI waveguide 24 and the photodiode 22 have the same width which is constant with respect to the propagating direction of light.

Figure 3B:
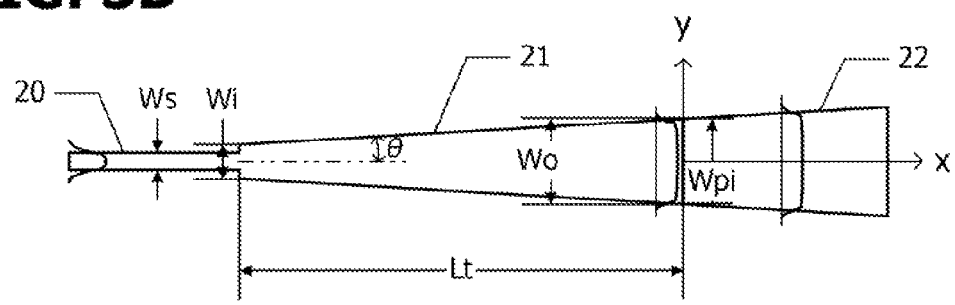
FIG. 3B is a partial plan view of the optical receiver according to Embodiment 1.

FIG. 3B is a partial plan view of the optical receiver according to Embodiment 1. The tapered waveguide 21 is disposed between the input waveguide 20 and the photodiode 22. The input waveguide 20 have a width Ws of, for instance, 2.5 μm. The tapered waveguide 21 has a width Wi of 4.5 μm at the light-incident end and has a width Wo of 12 μm at the light-emitting end. The tapered waveguide 21 has a length Lt of 65 μm. Here, the tapered waveguide 21 has a half spread angle θ of about 3.3°. The half spread angle referred to here is defined as the angle from the center line to either edge of the tapered waveguide 21.

The width Wpi of the photodiode 22 at the connection point between the tapered waveguide 21 and the photodiode 22 (namely, the width of the photodiode 22 at the light-incident end) is equal to the width Wo of the tapered waveguide 21 at its light-emitting end. The width of the photodiode 22 increases as it extends away from the light-emitting end of the tapered waveguide 21. The half spread angle of the photodiode 22 is equal to the half spread angle θ of the tapered waveguide 21. Accordingly, the edges of the photodiode 22 coincide with the extensions of the edges of the tapered waveguide 21.

The core layer 32 (FIGS. 2A and 2B) was made of InGaAsP with a compositional wavelength of 1.05 μm. The core layer 32 had a refractive index of 3.25. The InP cladding layers 31, 33, and 35 surrounding the core layer 32 have a refractive index of 3.17.

Figure 4:
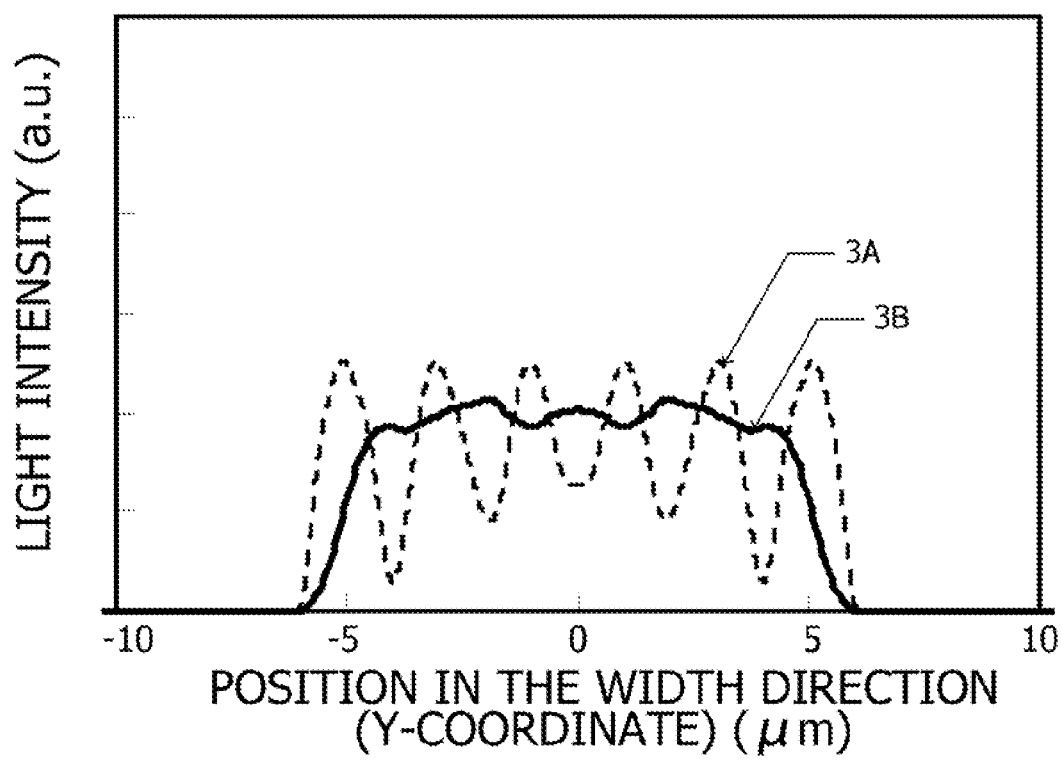
FIG. 4 is a graph illustrating a result of simulation of the light intensity distribution in the width direction at the light-emitting end of the MMI waveguide and the tapered waveguide of the optical receiver as given in FIGS. 3A and 3B.

FIG. 4 illustrates results of simulation of the light intensity distribution at the light-emitting end for cases where a single mode light with a wavelength 1.55 μm enters the MMI waveguide 24 given in FIG. 3A or the tapered waveguide 21 given in FIG. 3B. Here, an x-y orthogonal coordinate system is defined with the light propagation in the positive direction along the x axis. The width-direction center is assumed to be located at zero in the y-axis, and the light-emitting end of the tapered waveguide 21 and the light-emitting end of the MMI waveguide 24 are assumed to be located at zero in the x-axis. In FIG. 4, the horizontal axis represents the position in the width direction (y-coordinate) in the unit of "μm" and the vertical axis represents the light intensity in arbitrary units. The broken line 3A and the continuous line 3B respectively illustrate the light intensity distribution at the position where the x-coordinate is zero in the optical receiver according to Comparative example and Embodiment 1 given in FIGS. 3A and 3B.

It is seen that the light intensity distribution at the light-emitting end of the tapered waveguide 21 according to Embodiment 1 is leveled more strongly than the light intensity distribution at the light-emitting end of the MMI waveguide 24 according to Comparative example. This means that the structure according to Embodiment 1 can reduce more effectively the maximum peak intensity in the light intensity distribution at the light-incident end of the photodiode 23.

The leveling of the light intensity distribution takes place because higher-order modes are excited as the optical signal propagates through the tapered waveguide 21. Therefore, it is preferable that the half spread angle θ of the tapered waveguide 21 is set in such a range that higher-order modes are excited.

Figure 5A:
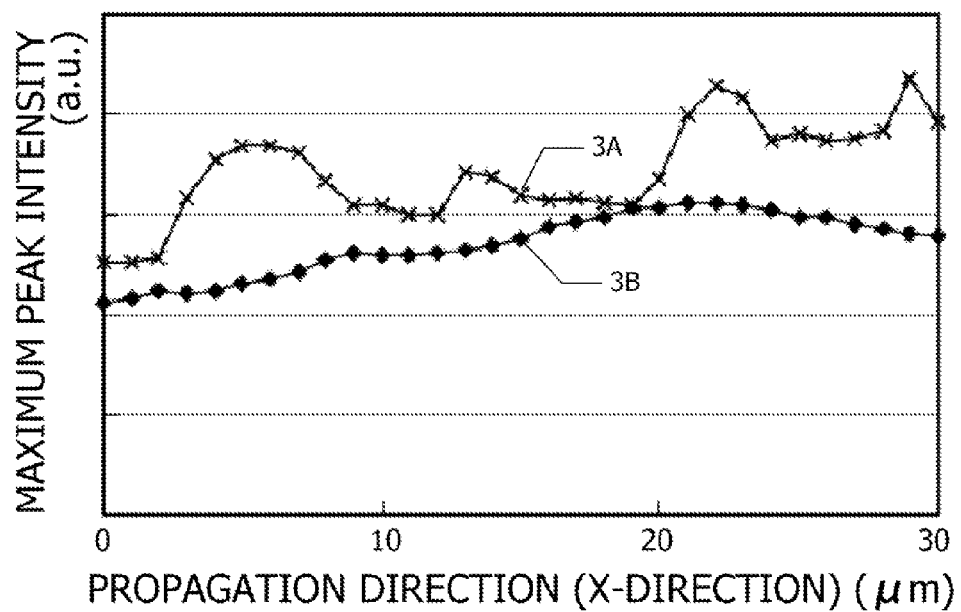
FIG. 5A is a graph illustrating a result of simulation of the maximum peak intensity distribution in the propagation direction in the photodiode in an optical receiver as illustrated in FIGS. 3A and 3B.

FIG. 5A illustrates results of simulation of the maximum peak intensity in the light intensity distribution with respect to the propagation direction (x-direction) in the photodiode 23 for cases where a single mode light with a wavelength 1.55 μm enters the MMI waveguide 24 given in FIG. 3A or the tapered waveguide 21 given in FIG. 3B. The horizontal axis represents the position (x-coordinate) in the light propagate direction in the unit of "μm" and the vertical axis represents the maximum peak intensity in arbitrary units. The crosses and the solid rhomboids in FIG. 5A respectively illustrate the maximum peak intensity in the photodiode 23 according to Comparative example and Embodiment 1 given in FIGS. 3A and 3B. Here, the attenuation caused by light absorption in the photodiode 23 is ignored.

Thus, the adoption of the structure according to Embodiment 1 also serves to level the maximum peak intensity with respect to the propagation direction in the photodiode 23. This means that a light intensity distribution leveled with respect to the width direction is maintained not only at the incident-side edge of the photodiode 22 (at the position zero in x-coordinate) but also at positions away in the propagation direction from the incident-side edge.

The simulation results in FIGS. 4 and 5A suggest that in the optical receiver according to Embodiment 1, the maximum peak intensity can be reduced to prevent an excessive rise in local photo carrier densities. Accordingly, the decrease in the operating bandwidth resulting from accumulated photo carriers can also be depressed even if the intensity of the input light is increased.

Figure 3C:
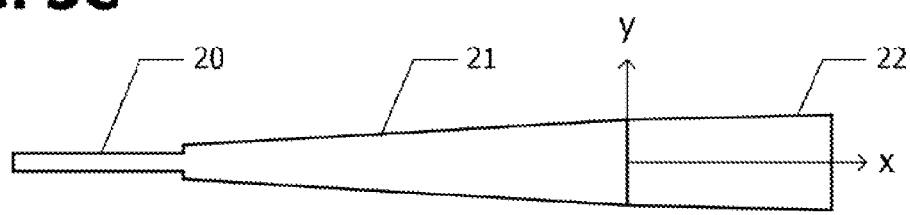
FIGS. 3C and 3D are partial plan views of an optical receiver according to Modifications 1 and 2, respectively, of Embodiment 1.
Figure 3D:
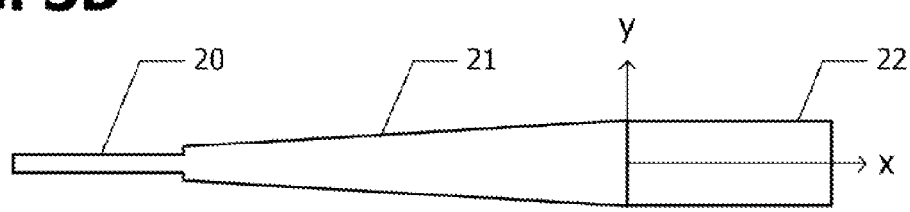

FIGS. 3C and 3D are partial plan views of optical receivers according to Modifications 1 and 2 of Embodiment 1. In Modification 1 given in FIG. 3C, the half spread angle of the photodiode 22 is smaller than the half spread angle θ of the tapered waveguide 21. In Modification 2 given in FIG. 3D, the width of the photodiode 22 is constant with respect to the propagation direction.

Figure 5B:
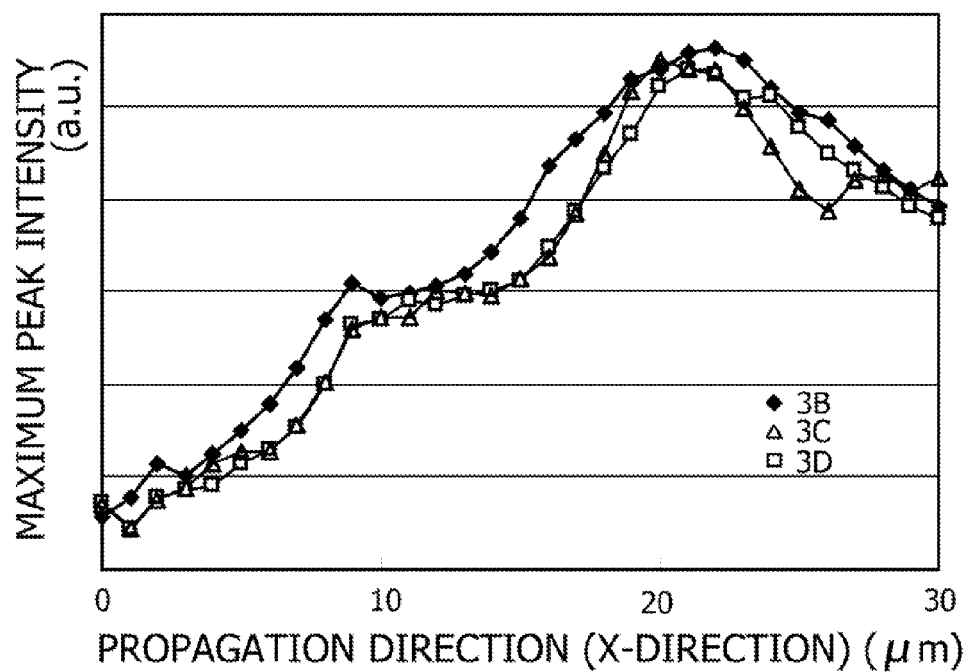
FIG. 5B is a graph illustrating a result of simulation of the maximum peak intensity distribution in the propagation direction in the photodiode in an optical receiver as illustrated in FIGS. 3B, 3C and 3D.

FIG. 5B illustrates the maximum peak intensity distribution in the photodiode 22 of the optical receiver according to Embodiment 1 given in FIG. 3B and Modifications 1 and 2 given in FIGS. 3C and 3D. The horizontal axis represents the position (x-coordinate) in the light propagating direction in the unit of "μm" and the vertical axis represents the maximum peak intensity in arbitrary units. In FIG. 5B, the solid rhomboids, hollow triangles, and hollow squares respectively illustrate the maximum peak intensity in the optical receiver given in FIGS. 3B, 3C and 3D.

It is seen that the maximum peak intensities in Modifications 1 and 2 given in FIGS. 3C and 3D are lower than the maximum peak intensity in Embodiment 1 given in FIG. 3B. To decrease the maximum peak intensity, it is preferable that the half spread angle of the photodiode 22 is smaller than the half spread angle of the tapered waveguide 21 or that the photodiode 22 has a constant width (that is, has a half spread angle of zero).

The area of the photodiode 22 also decreases if the half spread angle of the photodiode 22 is smaller than the half spread angle of the tapered waveguide 21 or if the photodiode 22 has a constant width. Accordingly, the parasitic capacitance may be reduced.

If the width of the photodiode 22 is gradually decreased as it extends away from the tapered waveguide 21, increase of the maximum peak intensity is encouraged in the photodiode 22. Therefore, it is preferable that the width of the photodiode 22 is maintained constant or increased gradually as it extends away from the light-emitting end of the tapered waveguide 21.

Figure 6:
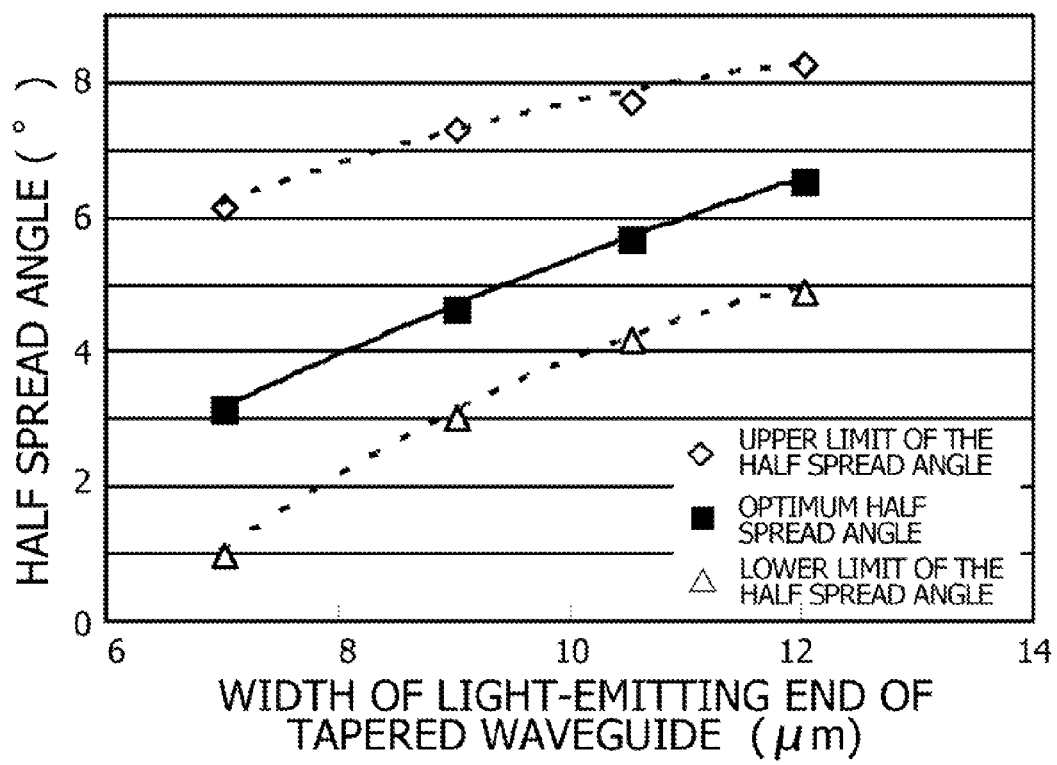
FIG. 6 is a graph illustrating preferred relations between the width of the light-emitting end and the half spread angle of a tapered waveguide.

Preferred values of the half spread angle θ of the tapered waveguide 21 are described below with reference to FIG. 6. The maximum peak intensity in the light intensity distribution at the light-emitting end was examined for various evaluation models in which the tapered waveguide 21 has various widths Wo at the light-emitting end in the range from 7 μm to 12 μm and also has various half spread angles θ. The tapered waveguide 21 had a width Wi of 4.5 μm at the light-incident end. FIG. 6 illustrates the preferred range of the width of the tapered waveguide 21 at the light-emitting end and that of the half spread angle θ. The horizontal axis represents the width Wo of the tapered waveguide 21 at the light-emitting end in the unit of "μm" and the vertical axis represents the half spread angle of the tapered waveguide 21 in the unit of "degree".

The solid squares illustrate the half spread angle to minimize the maximum peak intensity in the light intensity distribution at the light-emitting end of the tapered waveguide 21. These values of the peak intensity and the half spread angle are referred to hereafter as the reference peak intensity and the optimum half spread angle, respectively. The maximum peak intensity becomes higher than the reference peak intensity as the half spread angle θ is either decreased or increased from the optimum half spread angle. Of the half spread angle values at which the maximum peak intensity is 1.1 times the reference peak intensity, the one that is larger than the optimum half spread angle is referred to hereafter as the upper limit of the half spread angle while the other that is smaller than the optimum half spread angle is referred to hereafter as the lower limit of the half spread angle. In FIG. 6, the hollow rhomboids and hollow triangles represent the upper limit of the half spread angle and the lower limit of the half spread angle, respectively.

Denoting the width at the light-emitting end as Wo [μm] and the half spread angle as θ [°], the following quadratic equation approximates the curve that connect values of the lower limit of the half spread angle calculated for various values of the width Wo at the light-emitting end.

$$\theta = -0.0832 Wo^2 + 2.3667 Wo - 11.453$$

The following quadratic equation approximates the curve that connects values of the upper limit of the half spread angle calculated for various values of the width Wo at the light-emitting end.

$$\theta = -0.0392 Wo^2 + 1.1611 Wo + 0.0145$$

By setting the half spread angle θ in the following range, $$\theta \geq -0.08 Wo^2 + 2.37 Wo - 11.5, \text{ and}$$

$$\theta \leq -0.04 Wo^2 + 1.16 Wo + 0.0145$$

the maximum peak intensity can be maintained lower than 1.1 times the reference peak intensity.

An approximate curve that connects values of the optimum half spread angle is as follows.

$$\theta = -0.025 Wo^2 + 1.1573 Wo - 3.6994$$

Here, it is preferable that the half spread angle θpd [°] of the photodiode 22 is maintained in the following range.

$$0 \leq \theta pd \leq -0.04 Wo^2 + 1.16 Wo + 0.0145$$

If the wavelength of the light propagating through the waveguide is to be changed, the light-incident waveguide 20, the tapered waveguide 21, and the photodiode 22 should merely be enlarged or reduced while maintaining the horizontal to vertical ratios of their planar shapes. Therefore, the preferred values of the half spread angle θ will be maintained nearly in the same range as above even if the wavelength of the propagating light is varied.

Preferred values of the width increment at the light-incident end of the tapered waveguide 21 as compared with the light-incident waveguide 20 are described below with reference to FIG. 7. The maximum peak intensity at the light-emitting end was examined for various evaluation models in which the input waveguide 20 differs in width Wo at the light-emitting end in the range from 7 μm to 12 μm and the tapered waveguide 21 also differs in width Wi at the light-incident end. The width Ws of the light-incident waveguide 20 was set to 2.5 μm and the half spread angle θ of the tapered waveguide 21 was set so that the maximum peak intensity is minimized at each width Wi.

Figure 7:
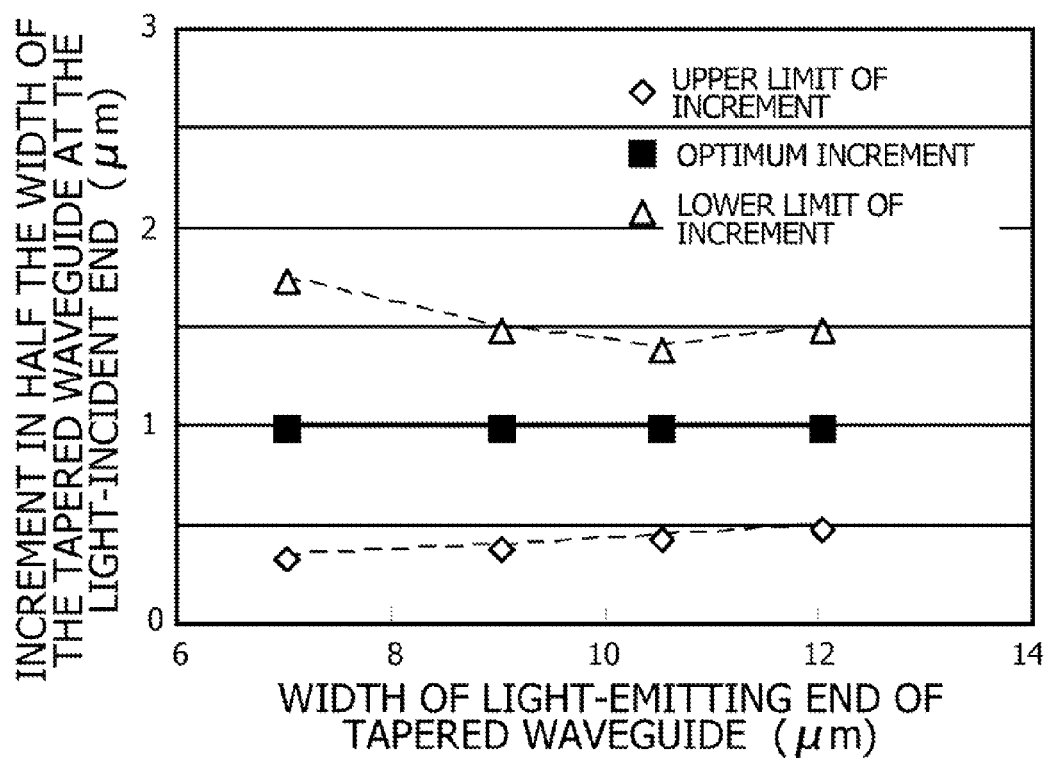
FIG. 7 is a graph illustrating preferred relations between the width of the tapered waveguide at the light-emitting end and the increment in half the width of the tapered waveguide at the light-incident end.

In FIG. 7, the horizontal axis represents the width Wo of the tapered waveguide 21 at the light-emitting end in the unit of "μm" and the vertical axis represents the increment in half the width of the tapered waveguide 21 at the light-incident end in the unit of "μm". The increment in half the width of the waveguide is equal to (Wi−Ws)/2.

The solid squares represent the increment in half the width of the waveguide at which the maximum peak intensity is minimized. These values of the maximum peak intensity and the increment in half the width of the waveguide are referred to hereafter as the reference peak intensity and the optimum width increment, respectively. The maximum peak intensity becomes higher than the reference peak intensity as the width increment is either decreased or increased from the optimum width increment. Of the width increment values at which the maximum peak intensity is 1.1 times the reference peak intensity, the one that is larger than the optimum width increment is referred to hereafter as the upper limit of the width increment while the other that is smaller than the optimum width increment is referred to hereafter as the lower limit of the width increment. In FIG. 7, the hollow triangles and hollow rhomboids represent the upper limit of the width increment and the lower limit of the width increment, respectively.

It is seen that the maximum peak intensity is maintained equal to or lower than 1.1 times the reference peak intensity if the increment in half the width of the waveguide is in the range of 0.5 μm to 1.5 μm under the condition that the width of the tapered waveguide 21 at the light-emitting end is in the range of at least 7 μm to 12 μm. When the increment in half the width of the waveguide is 0.5 μm and 1.5 μm, the width Wi of the tapered waveguide 21 at the light-incident end is 1.4 times and 2.2 times the width Ws of the input waveguide 20, respectively.

If the wavelength of the propagating light is to be changed, the waveguide should merely be enlarged or reduced while maintaining the horizontal to vertical ratio of its planar shape. In generally, therefore, it is preferable that the width of the tapered waveguide 21 at the light-incident end is in the range of 1.4 times to 2.2 times the width of the input waveguide 20.

To enhance the light absorption efficiency of the photodiode 22, it is preferable to increase its two-dimensional size. However, an increase in the two-dimensional size causes an increase in the parasitic capacitance, and therefore, it is not preferable to increase the two-dimensional size of the photodiode 22 with the aim of increasing the operating bandwidth. The optimum two-dimensional size of the photodiode 22 depends on the intended bandwidth and the light absorption efficiency. A great part of the light entering the photodiode 22 is absorbed as it propagates in a region having a length of about 12 μm from the light-incident end. A large effect in enhancing the light absorption efficiency cannot be expected, therefore, if the size of the photodiode 22 increased to more than about 12 μm in the light propagation direction.

The width of the photodiode 22 is determined from its two-dimensional size and length. The width of the photodiode 22 is equal to that of the tapered waveguide 21 at the light-emitting end. Based on the above considerations, it is preferable that the width of the tapered waveguide 21 at the light-emitting end is in the range of 2 times to 6 times the width of the input waveguide 20.

Embodiment 2

Figure 8:
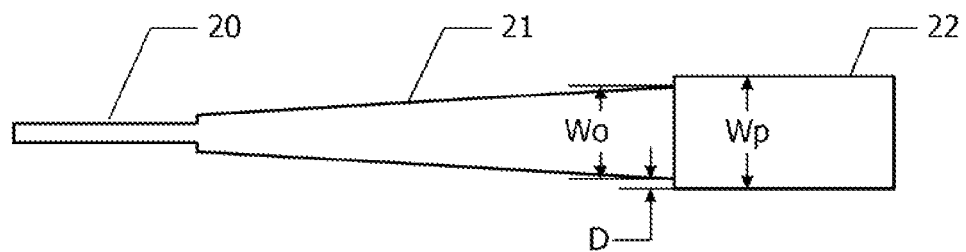
FIG. 8 is a partial plan view of an optical receiver according to Embodiment 2.

FIG. 8 is a partial plan view of the optical receiver according to Embodiment 2. It is compared with Modification 2 according to Embodiment 1 illustrated in FIG. 3D and differences in their constitution are discussed below. In Modification 2 given in FIG. 3D, the width of the photodiode 22 is equal to the width Wo of the tapered waveguide 21 at the light-emitting end. In Embodiment 2, the width Wp of the photodiode 22 is larger than the width Wo of the tapered waveguide 21 at the light-emitting end. With respect to the width direction, the center of the photodiode 22 coincides with that of the tapered waveguide 21. The relation of the increment D in half the width Wp of the photodiode 22 to the width Wo of the tapered waveguide 21 at the light-emitting end is as follows.

$$D=(Wp-Wo)/2$$

In an embedded type waveguide comprising an embedding semiconductor layer 35 located on the sides of the core layer 32 (FIGS. 2A and 2B), the propagating light leaks laterally from the core layer 32. If the propagating light has a wavelength of 1.55 μm, the leakage length is about 0.2 μm. If the width Wp of the photodiode 22 is designed to be larger than the width Wo of the tapered waveguide 21 at the light-emitting end, the light component that has leaked laterally out of the tapered waveguide 21 can be received by the photodiode 22.

The parasitic capacitance will become too large if the width Wp of the photodiode 22 is increased excessively. To allow the leak component to be incorporated while preventing the increase in parasitic capacitance, it is preferable that the increment D in half the width of the photodiode 22 is equal to or less than 0.3 μm. To achieve an adequate effect of the incorporation of the leak component, it is preferable that the increment D in half the width of the waveguide is equal to or larger than 0.1 μm.

Embodiment 3

Figure 9:
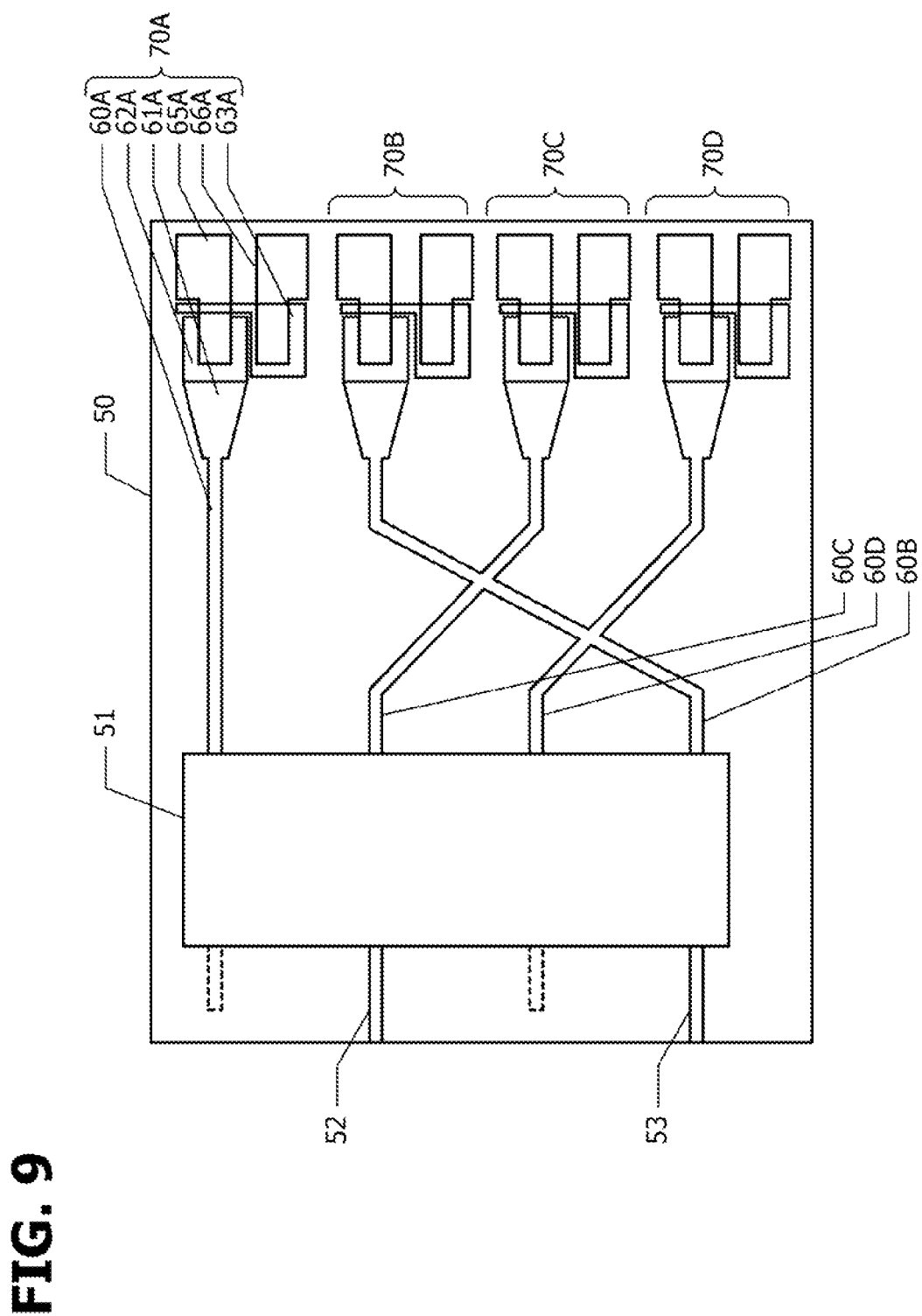
FIG. 9 is a plan view of a coherent optical receiver according to Embodiment 3.

FIG. 9 is a plan view of a coherent optical receiver according to Embodiment 3. The coherent optical receiver according to Embodiment 3 is applied to QPSK system.

A hybrid waveguide 51 and a first to a fourth optical receiving element 70A to 70D are formed on a semi-insulating substrate 50. The hybrid waveguide 51 comprises a MMI waveguide with four input ports and four output ports. The first to fourth input ports are provided in this order from top to bottom at the input end of the MMI waveguide as illustrated in FIG. 9 while the first to fourth output ports are provided in this order from top to bottom at the output end.

A modulated signal waveguide 52 is connected to the second input port of the hybrid waveguide 51 and a local oscillator waveguide 53 is connected to its fourth input port. No waveguide is connected to the first and the third input ports. The first to fourth optical receiving elements 70A to 70D are arranged in this order and in the same direction as the first to fourth output ports of the hybrid waveguide 51.

The first optical receiving element 70A contains an input waveguide 60A, tapered waveguide 61A, photodiode 62A, n-type cladding layer 63A, p-side electrode pad 65A, and n-side electrode pad 66A. The second to fourth optical receiving elements 70B to 70D have the same structure as the first optical receiving element 70A.

Each of the first to fourth optical receiving elements 70A to 70D has the same structure as the optical receivers according to Embodiment 1 or Embodiment 2. For instance, the substrate 50 corresponds to the substrate 30 according to Embodiment 1 (FIG. 1B and FIGS. 2A to 2C). The input waveguide 60A, tapered waveguide 61A, and photodiode 62A correspond respectively to the input waveguide 20, tapered waveguide 21, and photodiode 22 according to Embodiment 1 (FIGS. 1A and 1B). The p-side electrode pad 65A and n-side electrode pad 66A correspond respectively to the p-side electrode pad 25 and n-side electrode pad 26 according to Embodiment 1 (FIG. 1A).

The input waveguides 60A, 60B, 60C, and 60D in the first, second, third, and fourth optical receiving elements 70A, 70B, 70C, and 70D are connected to the first, fourth, second, third output ports, respectively, of the hybrid waveguide 51. The input waveguide 60B of the second optical receiving element 70B crosses the input waveguide 60C of the third optical receiving element 70C and the input waveguide 60D of the fourth optical receiving element 70D. The crosstalk between the input waveguides can decrease to a negligible level as the crossing angle becomes closer to right angle (90°).

The QPSK modulated optical signal propagates through the modulated signal waveguide 52 and enters the hybrid waveguide 51. The local oscillator light propagates through the local oscillator optical waveguide 53 and enters the hybrid waveguide 51. The QPSK modulated optical signal is converted to intensity-modulated optical signal and emitted from the first to fourth output ports.

The QPSK modulated I-channel signal is derived from the first and second optical receiving elements 70A and 70B, and the Q-channel signal is derived from the third and fourth optical receiving elements 70C and 70D.

The n-type cladding layers in the first to fourth optical receiving elements 70A to 70D are separated from each other by providing a groove etc., between the optical receiving elements in order to prevent direct conduction between adjacent optical receiving elements. This serves to ensure adequate electric separation among the first to fourth optical receiving elements 70A to 70D. As a result, the electrical crosstalk between the photodiodes can be reduced to prevent the occurrence of errors. A method to form a groove for separation between n-type cladding layers is described below with reference to FIG. 2C.

An embedding semiconductor layer 35 is formed first, followed by forming a mask pattern that has an aperture in the portion where a groove is to be produced. This mask pattern is made, for instance, of silicon oxide. Using the mask pattern as an etching mask, a groove reaching the bottom face of the n-type cladding layer 31 is formed. Then, the mask pattern is removed.

In Embodiment 3, the optical receivers according to Embodiment 1 or Embodiment 2 are used as the first to fourth optical receiving elements 70A to 70D. The maximum peak intensity in the light intensity distribution in the photodiode can be depressed. This serves to depress the reduction in the operating bandwidth that can be caused when the intensity of the local oscillator light is increased.

Embodiment 4

Figure 10:
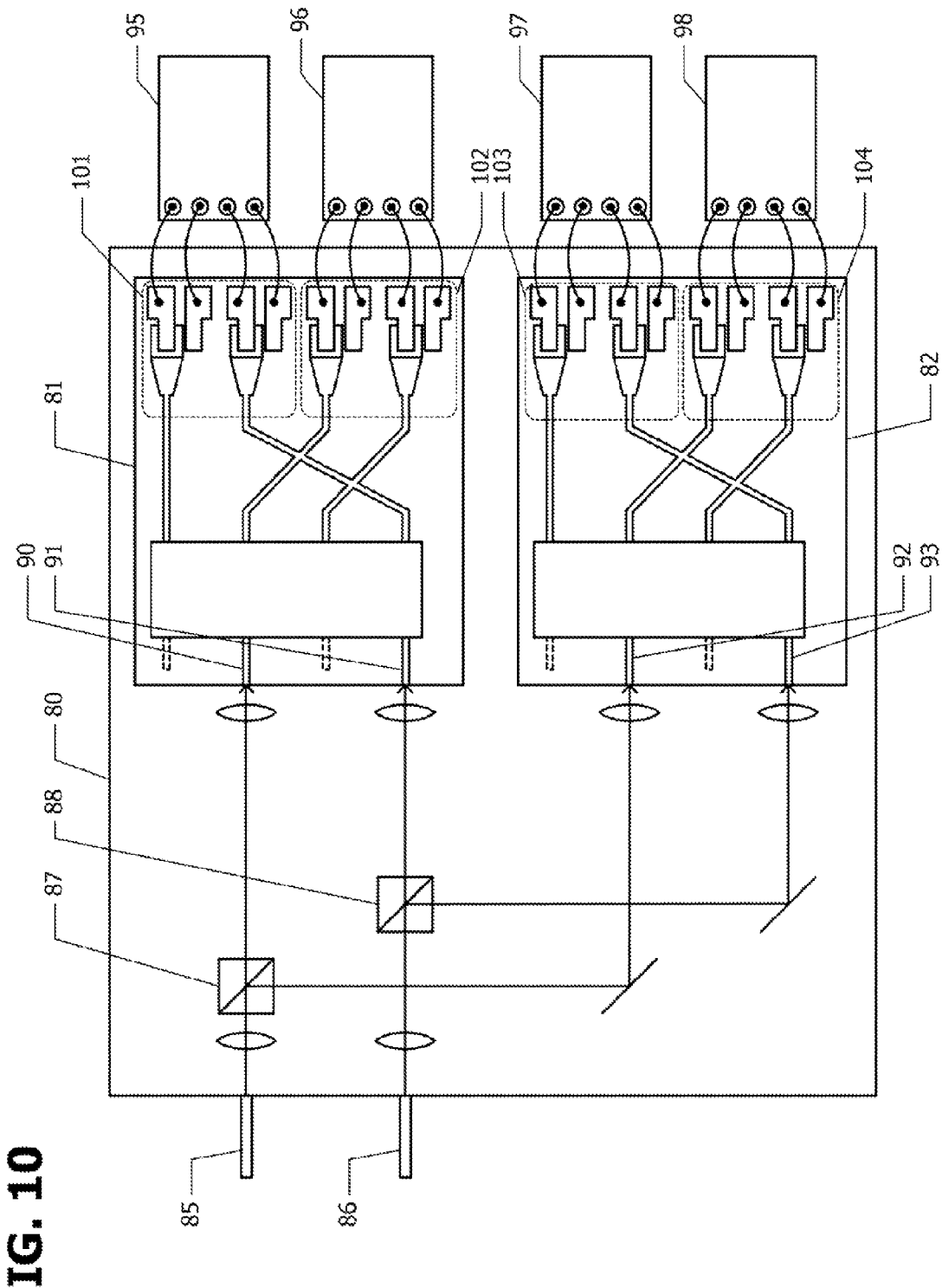
FIG. 10 is a plan view of a coherent optical receiver module according to Embodiment 4.

FIG. 10 is a plan view of a coherent optical receiver module according to Embodiment 4. The coherent optical receiver module according to Embodiment 4 is applied to dual polarization quadrature phase shift keying (DP-QPSK) systems.

A first and a second coherent optical receiver 81 and 82 and a first and a second beam splitter 87 and 88 are mounted on a mounting board 80. The first and the second coherent optical receiver 81 and 82 have the same structure as the coherent optical receiver according to Embodiment 3 illustrated in FIG. 9. An optical fiber 85 for optical signal and an optical fiber 86 for local oscillator light are mounted on the mounting board 80. The optical fiber 85 for the optical signal transmits DP-QPSK optical signal while the optical fiber 86 for local oscillator light transmits local oscillator light. The optical signal consists of a first and a second polarized component that are mutually orthogonal. The two polarized components transmit different signals.

The optical signal propagating through the optical fiber 85 for the optical signal is split into the first polarized component and the second polarized component by a first beam splitter 87. The first polarized component enters the modulated signal waveguide 90 of the first coherent optical receiver 81 and the second polarized component enters the modulated signal waveguide 92 of the second coherent optical receiver 82. The local oscillator light also consists of a first polarized component and a second polarized component. The local oscillator light propagating through the optical fiber 86 for the local oscillator light is split into the first polarized component and the second polarized component by a second beam splitter 88. The first polarized component enters the local oscillator optical waveguide 91 of the first coherent optical receiver 81 and the second polarized component enters the local oscillator optical waveguide 93 of the second coherent optical receiver 82. A condenser lens is mounted as needed on the mounting board 80.

A first and a second transimpedance amplifier 95 and 96 are provided subsequently to the first coherent optical receiver 81, and a third and a fourth transimpedance amplifier 97 and 98 are provided subsequently to the second coherent optical receiver 82.

The four electrode pads of the I-channel optical receiving elements 101 in the first coherent optical receiver 81 are connected to a first transimpedance amplifier 95, and the four electrode pads of the Q-channel optical receiving elements 102 are connected to a second transimpedance amplifier 96. The four electrode pads of the I-channel optical receiving elements 103 in the second coherent optical receiver 82 are connected to a third transimpedance amplifier 97, and the four electrode pads of the Q-channel optical receiving elements 104 are connected to a fourth transimpedance amplifier 98.

The first and the second coherent optical receiver 81 and 82 have the same structure as the coherent optical receiver according to Embodiment 3 illustrated in FIG. 9, making high-output and broadband operation possible.

Embodiments 1 to 4 given above are intended for description of cases where the optical signal has a wavelength in the 1.55 μm band. In cases where the propagating optical signal has a wavelength in a different wavelength band, what is necessary is only to replace the cladding layer, core layer and light absorption layer with those of semiconductor materials suitable for the wavelength band of the optical signal. The light absorption layer 37 of the photodiode 22 (FIG. 1B) described above is made of an undoped semiconductor, but the light absorption layer 37 may be partially or entirely made of a p-type or n-type semiconductor.

Described above is an embedded type waveguide in which the spaces on both sides of the waveguide and the photodiode are filled with an embedding semiconductor layer 35 (FIGS. 2A to 2C), but waveguides of other structures may be adopted. For instance, a high-mesa type waveguide or a ridge type waveguide may be adopted. Furthermore, as the substrate 30, an n-type or a p-type semiconductor or an insulation material such as sapphire may be used, instead of a semi-insulating semiconductor.

The core layer 32 and the light absorption layer 37 are assumed to have the same thickness in FIG. 1B, but they may have different thicknesses to serve for particular purposes. Furthermore, the p-side electrode pad 25 may be located on the semi-insulating embedding semiconductor layer 35 instead of forming a p-side lead electrode 27 of an air bridge structure.

In the constitutional examples given in FIGS. 3C and 3D, the position where the half spread angle θ starts changing (position zero on the x-axis) may not be exactly identical with the boundary between the core layer 32 and the light absorption layer 37 illustrated in FIG. 1B. An adequate effect can be achieved even if their positions are slightly apart from each other in the direction of light propagation (x-axis direction).

Optical receivers according to Embodiments 1 or 2 are applied to coherent optical receivers in Embodiments 3 and 4. The optical receivers according to Embodiments 1 or 2 can also be applied to other receivers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that the various changes, substitutions, and alterations could be made hereto without departing from the spirit and scope of the invention.

What is claimed is:

1. An optical receiver comprising:
   an input waveguide formed over a substrate,
   a photodiode formed over the substrate, and
   a tapered waveguide formed over the substrate, connecting between the input waveguide and the photodiode, and increasing in width as it extends from the input end that connects with the input waveguide to the output end that connects with the photodiode,
   wherein a half spread angle of the tapered waveguide is configured to cause higher-order mode excitation when receiving optical signal from the input waveguide, and
   the photodiode either has a constant width or increases in width as it extends away from the output end of the tapered waveguide, its half spread angle being equal to or less than the half spread angle of the tapered waveguide.

2. An optical receiver comprising:
   an input waveguide formed over a substrate,
   a photodiode formed over the substrate, and
   a tapered waveguide formed over the substrate, connecting between the input waveguide and the photodiode, and increasing in width as it extends from the input end that connects with the input waveguide to the output end that connects with the photodiode, wherein the half spread angle θ of the tapered waveguide is in the following range:

θ≥−0.08$Wo^2$+2.37$Wo$−11.5, and

θ≤−0.04$Wo^2$+1.16$Wo$+0.0145 where Wo [μm] denotes the width of the tapered waveguide at the joint between the tapered waveguide and the photodiode and θ [°] denotes the half spread angle, and the photodiode at the joint with the tapered waveguide has a width equal to or larger than that of the tapered waveguide at the output end, increases in width as it extends away from the output end of the tapered waveguide, and has a half spread angle θpd in the following range:

0≤θ$pd$≤−0.04$Wo^2$+1.16$Wo$+0.0145.

3. The optical receiver according to claim 1 wherein the photodiode at the joint between the tapered waveguide and the photodiode has a width larger than that of the tapered waveguide at the output end, the width being larger as measured from the center line to any of the outermost edges, and the width increment from the center line to any of the outermost edges being in a range of 0.1 μm to 0.3 μm.

4. The optical receiver according to claim 1 wherein the photodiode at the joint between the tapered waveguide and the photodiode has a width equal to that of the tapered waveguide at the output end.

5. The optical receiver according to claim 1 wherein the tapered waveguide at the joint between the input waveguide and the tapered waveguide has a width larger than that of the input waveguide.

6. The optical receiver according to claim 5 wherein the center of the input waveguide coincides with the center of the tapered waveguide at the input end of the tapered waveguide and the width of the tapered waveguide is in the range of 1.4 times to 2.2 times the width of the input waveguide.

7. The optical receiver according to claim 1 wherein the width of the tapered waveguide at the output end is in a range of 2 times to 6 times the width of the input waveguide.

8. An optical receiver comprising:
a hybrid waveguide formed over a substrate, having two input ports each designed to receive either phase-shift keyed optical signal or local oscillator light, and having two or more output ports each designed to emit intensity-modulated optical signal produced by converting the phase-shift keyed optical signal,
two or more input waveguides formed over the substrate, each connected to one of the output ports of the hybrid waveguide,
photodiodes formed over the substrate, each coupled to one of the input waveguides, and
tapered waveguides formed over the substrate to connect between the input waveguides and the relevant photodiodes,
wherein a half spread angle of each of the tapered waveguides is configured to cause higher-order mode excitation when receiving optical signal from the relevant input waveguide, and
each of the photodiodes either has a constant width or increases in width as it extends away from the output end of the tapered waveguide, its half spread angle being equal to or less than the half spread angle of the tapered waveguide.

9. The optical receiver according to claim 8 further comprising transimpedance amplifiers designed to receive electric signals from the photodiodes.

* * * * *